US012686196B2

(12) United States Patent
Wang et al.

(10) Patent No.: US 12,686,196 B2
(45) Date of Patent: Jul. 21, 2026

(54) DISPLAY MODULE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Jiaxiang Wang, Beijing (CN); Binfeng Feng, Beijing (CN); Chao Wang, Beijing (CN); Yangyang Cai, Beijing (CN); Chao Zhang, Beijing (CN); Fei Li, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 845 days.

(21) Appl. No.: 17/801,372

(22) PCT Filed: Oct. 22, 2021

(86) PCT No.: PCT/CN2021/125540
§ 371 (c)(1),
(2) Date: Aug. 22, 2022

(87) PCT Pub. No.: WO2022/134811
PCT Pub. Date: Jun. 30, 2022

(65) Prior Publication Data
US 2023/0081014 A1      Mar. 16, 2023

(30) Foreign Application Priority Data

Dec. 25, 2020   (CN) .......................... 202011557451.7

(51) Int. Cl.
B32B 17/06 (2006.01)
B32B 3/18 (2006.01)
(Continued)

(52) U.S. Cl.
CPC ................ B32B 17/06 (2013.01); B32B 3/18 (2013.01); B32B 3/266 (2013.01); B32B 7/12 (2013.01);
(Continued)

(58) Field of Classification Search
CPC ........... B32B 17/06; B32B 3/18; B32B 3/266; B32B 7/12; B32B 15/04; B32B 2255/00;
(Continued)

(56) References Cited

U.S. PATENT DOCUMENTS

2019/0243417 A1*   8/2019   Cheng ................... G06F 1/1605
2021/0111230 A1*   4/2021   Shin ..................... H10K 50/841
(Continued)

FOREIGN PATENT DOCUMENTS

CN          107241466 A      10/2017
CN          109637378 A      4/2019
(Continued)

*Primary Examiner* — Stephone B Allen
*Assistant Examiner* — Adam W Booher
(74) *Attorney, Agent, or Firm* — ArentFox Schiff LLP; Michael Fainbergv

(57) ABSTRACT

A display module and a display device. The display module includes a display panel, which has a display region (AA) and a light-transmitting region (BB), the light-transmitting region (BB) being provided with a light-transmitting hole (V1); a flexible cover plate, which is located on the light exit side of the display panel, and covers the display region (AA) and the light-transmitting region (BB); a transparent supporting structure, which is located on the side of the display panel facing the flexible cover plate, where the transparent supporting structure covers the light-transmitting hole (V1), and an orthogonal projection of the transparent supporting structure on the flexible cover plate and an orthogonal projection of the display panel on the flexible cover plate have an overlapping region.

12 Claims, 4 Drawing Sheets

(51) Int. Cl.

| | |
|---|---|
| *B32B 3/26* | (2006.01) |
| *B32B 7/12* | (2006.01) |
| *B32B 15/04* | (2006.01) |
| *G02B 5/00* | (2006.01) |
| *G02B 5/30* | (2006.01) |
| *H10K 59/80* | (2023.01) |

(52) U.S. Cl.
CPC ........... *G02B 5/005* (2013.01); *G02B 5/3025* (2013.01); *H10K 59/871* (2023.02); *H10K 59/8791* (2023.02); *B32B 15/04* (2013.01); *B32B 2255/00* (2013.01); *B32B 2307/412* (2013.01); *B32B 2307/42* (2013.01); *B32B 2457/20* (2013.01); *B32B 2457/208* (2013.01)

(58) Field of Classification Search
CPC .......... B32B 2307/412; B32B 2307/42; B32B 2457/20; B32B 2457/208; H10K 59/8791; H10K 59/871; H10K 59/65; H10K 59/8792; H10K 59/00; G02B 5/005; G02B 5/3025; G06F 1/1686; H04N 23/57
See application file for complete search history.

(56) References Cited

U.S. PATENT DOCUMENTS

| | | | | |
|---|---|---|---|---|
| 2021/0135151 A1* | 5/2021 | Baek | .................... | G06F 3/046 |
| 2021/0384478 A1* | 12/2021 | Ge | .................... | H10K 50/868 |
| 2022/0246884 A1 | 8/2022 | Yan et al. | | |
| 2022/0344426 A1 | 10/2022 | Wang et al. | | |
| 2023/0273358 A1* | 8/2023 | You | .................... | G02B 5/30 |
| | | | | 349/96 |

FOREIGN PATENT DOCUMENTS

| | | | |
|---|---|---|---|
| CN | 209045561 U | 6/2019 |
| CN | 111273476 A | 6/2020 |
| CN | 111276048 A | 6/2020 |
| CN | 210956676 U | 7/2020 |
| CN | 111697043 A | 9/2020 |
| CN | 111785756 A | 10/2020 |
| CN | 211743161 U | 10/2020 |
| CN | 111885237 A | 11/2020 |
| CN | 112635535 A | 4/2021 |
| CN | 214042890 U | 8/2021 |
| WO | 2022/134811 A1 | 6/2022 |

* cited by examiner

DISPLAY MODULE AND DISPLAY DEVICE

CROSS REFERENCE TO RELATED APPLICATION

The present application is a US National Stage of International Application No. PCT/CN2021/125540, filed on Oct. 22, 2021, which claims the priority to Chinese Patent Application No. 202011557451.7, filed to the Chinese Patent Office on Dec. 25, 2020 and entitled "Display Module and Display Device", which is incorporated herein by reference in its entirety.

FIELD

The present disclosure relates to the technical field of display, in particular to a display module and a display device.

BACKGROUND

In order to achieve a higher screen-to-body ratio in a display panel, a light-transmitting region may be arranged in a display region of the display panel, and a camera, etc. are further arranged in the light-transmitting region.

SUMMARY

A display module provided in an embodiment of the present disclosure includes:

a display panel including a display region and a light-transmitting region, where the light-transmitting region has a light-transmitting hole;

a cover film located on a light-emitting side of the display panel and covering the display region and the light-transmitting region; and a transparent supporting structure located on one side, facing the cover film, of the display panel; where the transparent supporting structure covers the light-transmitting hole, and an orthographic projection of the transparent supporting structure on the cover film and an orthographic projection of the display panel on the cover film have an overlapping region.

Optionally, in the display module provided in the embodiment of the present disclosure, a material of the transparent supporting structure is transparent glass.

Optionally, in the display module provided in the embodiment of the present disclosure, the display module further includes a polarizer located on one side, facing the cover film, of the display panel; where the polarizer and the transparent supporting structure are located on the same layer, the polarizer is arranged around the transparent supporting structure, and a gap is provided between the polarizer and the transparent supporting structure.

Optionally, in the display module provided in the embodiment of the present disclosure, the gap has a width greater than or equal to 0.45 mm in an extending direction of the cover film.

Optionally, in the display module provided in the embodiment of the present disclosure, the polarizer has the same thickness as the transparent supporting structure in a thickness direction of the display panel.

Optionally, in the display module provided in the embodiment of the present disclosure, the display module further includes an optically clear adhesive layer located between the polarizer and the cover film; where an orthographic projection of the optically clear adhesive layer on the cover film covers orthographic projections of the display region and the light-transmitting region on the cover film, and the transparent supporting structure is bonded to the optically clear adhesive layer.

Optionally, in the display module provided in the embodiment of the present disclosure, the display module further includes a light-shielding layer located on one side, facing the display panel, of the cover film; where an orthographic projection of the light-shielding layer on the cover film covers part of the light-transmitting hole and an orthographic projection of a portion, adjacent to light-transmitting hole, of the display region on the cover film; a first through hole is arranged in a position, corresponding to the light-transmitting hole, in the light-shielding layer; and the first through hole has a smaller diameter than the light-transmitting hole.

Optionally, in the display module provided in the embodiment of the present disclosure, a central axis of the first through hole coincides with a central axis of the light-transmitting hole; and an overlapping portion of the orthographic projections of the light-shielding layer and the transparent supporting structure on the cover film has a width greater than or equal to 0.4 mm.

Optionally, in the display module provided in the embodiment of the present disclosure, a material of the light-shielding layer is ink.

Optionally, in the display module provided in the embodiment of the present disclosure, in an extension direction of the cover film, a distance between an inner wall of the light-transmitting hole and a side edge of the transparent supporting structure is greater than or equal to 0.44 mm.

Optionally, in the display module provided in the embodiment of the present disclosure, the display module further includes a back film located on one side, away from the cover film, of the display panel; where the back film has a second through hole corresponding to the light-transmitting hole.

Optionally, in the display module provided in the embodiment of the present disclosure, the display module further includes a supporting layer located on one side, away from the cover film, of the back film; where the supporting layer has a third through hole corresponding to the light-transmitting hole; and a distance between an inner wall of the third through hole and an inner wall of the light-transmitting hole is larger than 0 in an extension direction of the cover film.

Correspondingly, an embodiment of the present disclosure further provides a display device. The display device includes the above display module.

Optionally, in the display device provided in the embodiment of the present disclosure, the display device further includes a camera at least partially located in the light-transmitting hole.

DETAILED DESCRIPTION OF THE EMBODIMENTS

Figure 1:
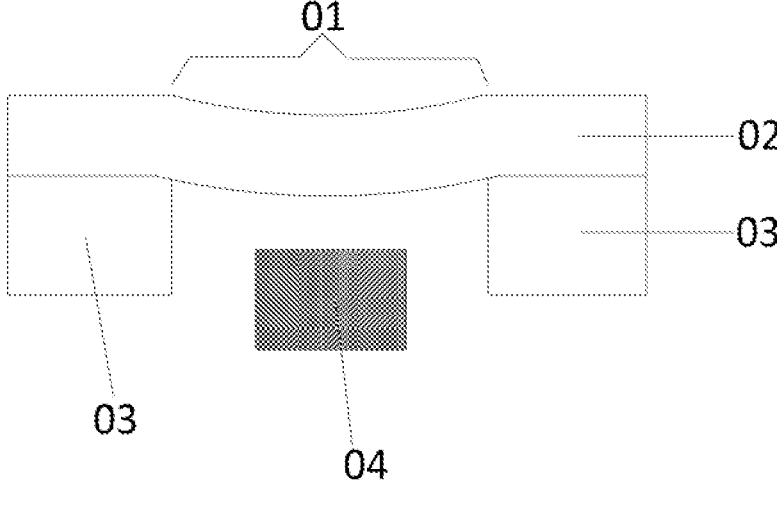
FIG. 1 is a schematic diagram of a sectional structure of a display panel in the related art.

For making the objectives, technical solutions and advantages of embodiments of the present disclosure more obvious, the technical solutions of the embodiments of the present disclosure will be clearly and completely described below in conjunction with the accompanying drawings in the embodiments of the present disclosure. Apparently, the embodiments described are some embodiments rather than all embodiments of the present disclosure. Furthermore, the embodiments in the present disclosure and features in the embodiments may be combined without conflicts. Based on the described embodiments of the present disclosure, all other embodiments acquired by those skilled in the art without making creative efforts fall within the scope of protection of the present disclosure.

Unless otherwise defined, technical or scientific terms used in the present disclosure are to be given their ordinary meaning as understood by those of ordinary skill in the art to which the present disclosure belongs. The use of "first", "second," and similar words in the present disclosure does not denote any order, number, or importance, but is merely used to distinguish different components. "Comprise", "include" and similar words mean that elements or items appearing before the word encompass elements or items listed after the word and equivalents thereof, but do not exclude other elements or items. "Connect", "connected" and similar words are not restricted to physical or mechanical connections, but may include electrical connections, whether direct or indirect. "Inner", "outer", "upper", "lower", etc. are merely used to indicate a relative positional relation, and when an absolute position of the described object is changed, the relative positional relation may also be changed accordingly.

It is noted that sizes and shapes of graphs in the drawings do not reflect true scale, and are merely illustrative of the present disclosure. Furthermore, same or similar reference numerals refer to the same or similar elements or elements having the same or similar function throughout.

As the display panel industry requires an increasingly higher screen-to-body ratio, full-screen display products (for example, mobile phones) have been rapidly popularized throughout the market. In the case of a novel full-screen mobile phone, a hole is dug in the middle of a display module, to accommodate a photosensitive component, for example, a camera. Meanwhile, in order to guarantee portability of the display products, a foldable display screen becomes a trend. However, in consideration of hole digging in the middle of the display module and the foldable display screen, a rigid cover plate (cover glass) is replaced with a flexible cover plate (cover film) for the foldable module. In an embodiment, as shown in FIG. 1, only a cover film 02 is reserved in a hole digging region 01 in general, and remaining film layers and structures in a display panel 03 all need to be cut off, such that a camera 04 may be arranged in the hole digging region 01. However, for the current product, the problem of sagging of the cover film 02 in the hole digging region 01 is likely to occur, and a light refraction angle at the sagging portion is further changed, which influences imaging quality of the camera 04, that is, influences picture photographing performance of the display product (for example, a mobile phone).

Figure 2:
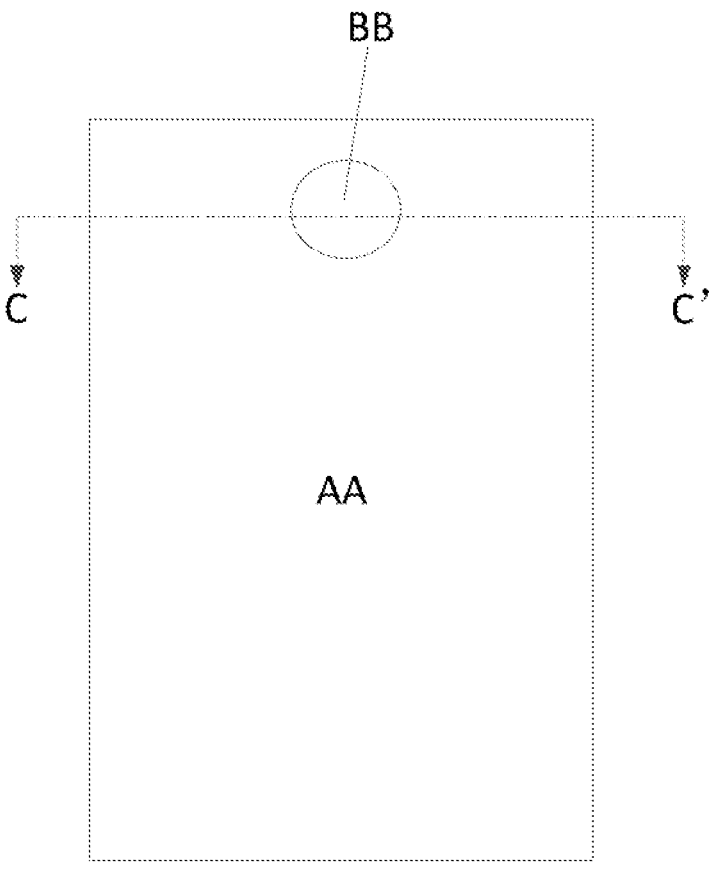
FIG. 2 is a schematic structural diagram of a top view of a display module provided in an embodiment of the present disclosure.
Figures 3, 4:
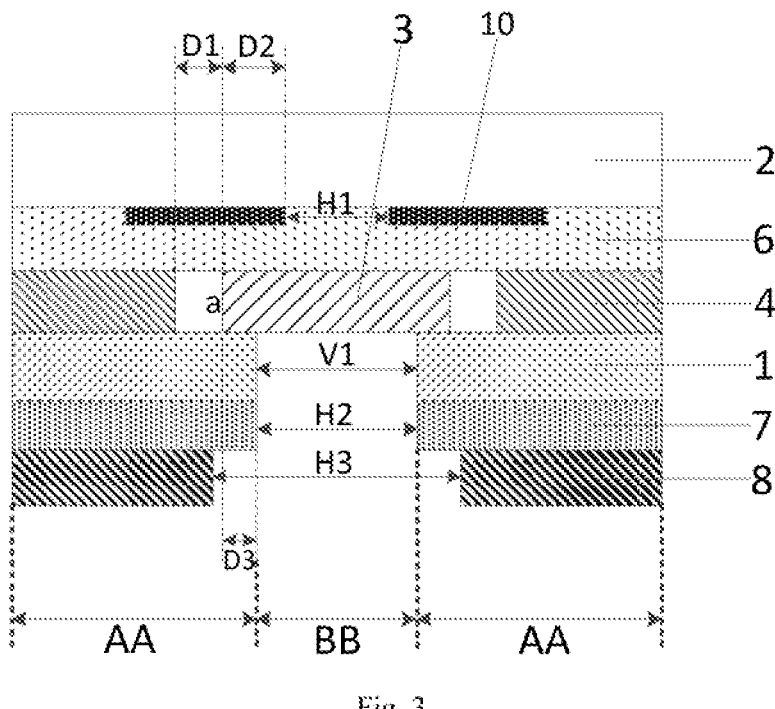
FIG. 3 is a schematic diagram of a sectional structure of a display module provided in an embodiment of the present disclosure.
FIG. 4 is a schematic diagram of a sectional structure of another display module provided in an embodiment of the present disclosure.

In view of this, an embodiment of the present disclosure provides a display module. As shown in FIGS. 2 and 3, FIG. 2 is a schematic diagram of a top view structure of the display module, and FIG. 3 is a sectional schematic diagram in a direction CC' in FIG. 2. The display module may include:

a display panel 1 including a display region AA and a light-transmitting region BB, where the light-transmitting region BB has a light-transmitting hole V1; where arranging the display region AA around the light-transmitting region BB is taken as an example in FIG. 1 of the present disclosure, certainly, the light-transmitting region BB may also be arranged at a boundary of the display region AA, and the position of the light-transmitting region BB is not specifically limited herein;

a cover film 2 located on a light-emitting side of the display panel 1 and covering the display region AA and the light-transmitting region BB; and a transparent supporting structure 3 located on one side, facing the cover film 2, of the display panel 1; where the transparent supporting structure 3 covers the light-transmitting hole V1, and an orthographic projection of the transparent supporting structure 3 on the cover film 2 and an orthographic projection of the display panel 1 on the cover film 2 have an overlapping region.

According to the display module provided in the embodiment of the present disclosure, the transparent supporting structure is located on one side, facing the cover film, of the display panel; and the transparent supporting structure covers the light-transmitting hole, such that the transparent supporting structure is arranged between an upper portion of the light-transmitting hole of the display panel and the cover film. The transparent supporting structure may have strength compensation on the position of the light-transmitting hole; and the orthographic projection of the transparent supporting structure on the cover film and the orthographic projection of the display panel on the cover film have an overlapping region, that is, a periphery of the transparent supporting structure is supported by the display panel, such that the transparent supporting structure may better support the cover film at the light-transmitting hole and prevent the cover film from sagging. Therefore, the display module provided in the embodiments of the present disclosure may prevent the problem that photographing performance of the camera is influenced by sagging of the cover film at the light-transmitting hole (that is, the camera hole) due to the fact that the other light-proof film layers are cut off at the light-transmitting hole.

During specific implementation, the display panel may be a flexible display panel. The display panel may include: a driving layer, a light emitting layer, and an encapsulation layer which are stacked. The driving layer may include a plurality of metal film layers and a plurality of inorganic insulating film layers; the light emitting layer may include an anode, an organic light emitting layer and a cathode; and the encapsulation layer may be a thin film encapsulation layer. The light-transmitting hole may be a through hole, that is, the light-transmitting hole penetrates all film layers of the display panel. Alternatively, the light-transmitting hole may also be a blind hole including a transparent layer, that is, the light-transmitting hole penetrates part of light-proof film layers of the display panel. The transparent layer may be made from silicon oxide or silicon nitride or another transparent insulating layer, and the material of the transparent layer is not specifically limited herein.

During specific implementation, in the display module provided in the embodiment of the present disclosure, the material of the transparent supporting structure may be transparent glass. Transparent glass is used as a material of the transparent supporting structure and is arranged above the light-transmitting hole of the display panel, such that the cover film may be supported, and light transmission of the light-transmitting hole may not be influenced. Certainly, it should be understood that the material of the transparent supporting structure may be selected according to specific application requirements as long as the material is a transparent material which does not influence the light transmission of the light-transmitting hole and the transparent supporting structure manufactured can have a support effect, and falls in the scope of protection of the present disclosure; and the material of the transparent supporting structure is not specifically limited herein.

During specific implementation, in the display module provided in the embodiment of the present disclosure, in order to prevent the problem that a viewing effect and a contrast ratio are influenced by reflection of ambient light back to the display panel, as shown in FIG. 3, the display module further includes a polarizer 4 located on one side, facing the cover film 2, of the display panel 1. The polarizer 4 and the transparent supporting structure 3 may be arranged on the same layer. The polarizer 4 and the transparent supporting structure 3 being located on the same layer may have an effect that the transparent supporting structure 3 supports the cover film 2 without increasing a thickness of the display module. The transparent supporting structure 3 is arranged on the cover film 2 and then attached to the display panel 1 provided with the polarizer 4, such that the polarizer 4 is arranged around the transparent supporting structure 3, and a gap is provided between the polarizer 4 and the transparent supporting structure 3, so as to facilitate fitting of the transparent supporting structure 3.

It is to be noted that the polarizer 4 and the transparent supporting structure 3 being located on the same layer does not mean that the polarizer 4 and the transparent supporting structure 3 are formed through a single patterning process, but means that the polarizer attached to the display panel 1 is provided with a through hole and the transparent supporting structure 3 is attached to the through hole of the polarizer 4, so as to make the transparent supporting structure 3 and the polarizer 4 be located on the same layer. So that the transparent supporting structure 3 may support the cover film 2 without increasing the thickness of the module.

Figure 5:
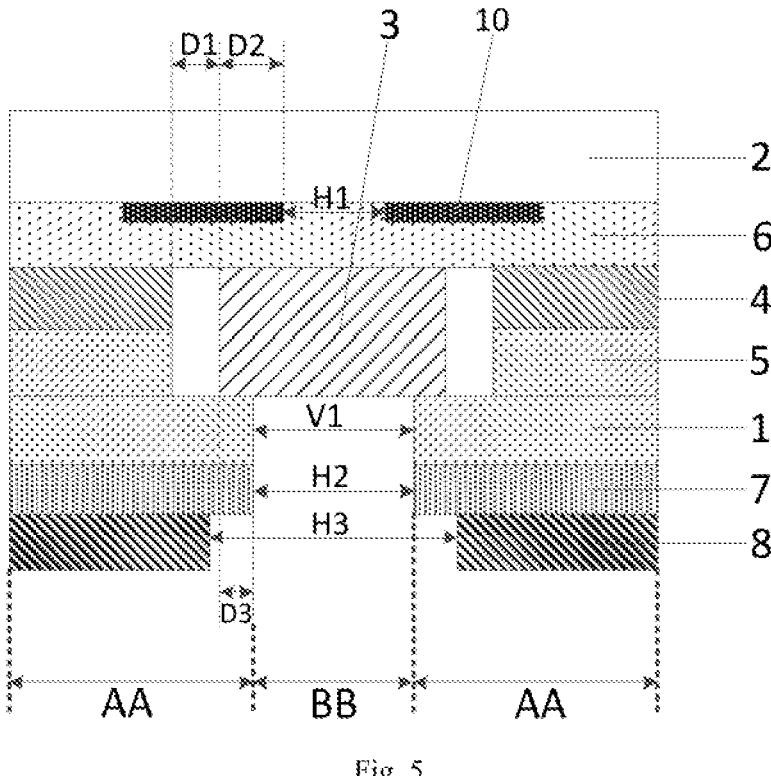
FIG. 5 is a schematic diagram of a sectional structure of yet another display module provided in an embodiment of the present disclosure.
Figure 6:
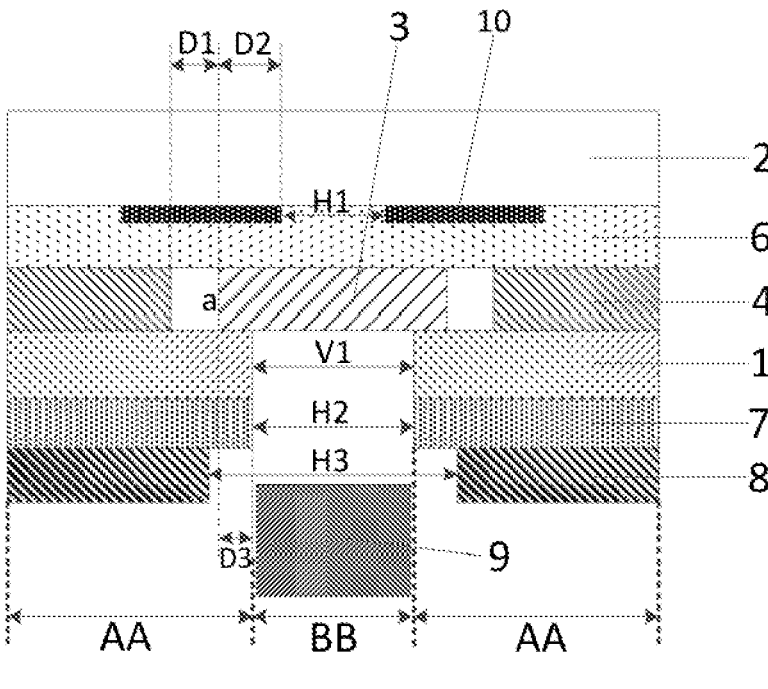
FIG. 6 is a schematic diagram of a sectional structure of a display device provided in an embodiment of the present disclosure.

During specific implementation, in the display module provided in the embodiment of the present disclosure, as shown in FIGS. 4 and 5, the display module may also be a display module with a touch function, the display module further includes a touch layer 5 located between the display panel 1 and the polarizer 4, and the touch layer 5 is free of metal wires at a position corresponding to the light-transmitting hole V1. When the display module includes the touch layer 5 located between the display panel 1 and the polarizer 4, as shown in FIG. 4, the touch layer 5 and the display panel 1 may be used for supporting the transparent supporting structure 3 simultaneously. It is also possible that only the display panel 1 supports the transparent supporting structure 3, as shown in FIG. 6.

During specific implementation, in the display module provided in the embodiment of the present disclosure, as shown in FIGS. 3-5, the display module further includes an optically clear adhesive layer 6 located between the polarizer 4 and the cover film 2, an orthographic projection of the optically clear adhesive layer 6 on the cover film 2 covers orthographic projections of the display region AA and the light-transmitting region BB on the cover film 2, that is, the optically clear adhesive layer 6 is a whole-surface structure, so as to bond the transparent supporting structure 3 to the optically clear adhesive layer 6. Specifically, optically clear adhesive (OCA) has high adhesive strength and high transparency, and does not influence a display effect of the display panel.

During specific implementation, in the display module provided in the embodiment of the present disclosure, as shown in FIGS. 3 and 4, the transparent supporting structure 3 is bonded to a position, corresponding to the light-transmitting hole V1, of the cover film 2 through the optically clear adhesive layer 6; and the polarizer 4 needs to be bonded to a position, apart from the position where the transparent supporting structure 3 is bonded, in the optically clear adhesive layer 6. Such that in order to guarantee that the optically clear adhesive layer 6 is firmly bonded around the polarizer 4, the polarizer 4 has the same thickness as the transparent supporting structure 3 in a thickness direction of the display panel 1, then the optically clear adhesive layer 6 may be flush bonded to the polarizer 4 and the transparent supporting structure 3, and flatness of the film layer is better.

During specific implementation, in the display module provided in the embodiment of the present disclosure, as shown in FIG. 5, when the display module includes a touch layer 5 and only the display panel 1 supports the transparent supporting structure 3, the thickness of the transparent supporting structure 3 may be to the same as a total thickness of the polarizer 4 and the touch layer 5 in the thickness direction of the display panel 1, such that the optically clear adhesive layer 6 may be flush bonded to the polarizer 4 and the transparent supporting structure 3, and flatness of the film layer is better.

During specific implementation, in the display module provided in the embodiment of the present disclosure, as shown in FIGS. 3-5, in order to solve the problem of light leakage, the display module further includes a light-shielding layer 10 located on one side, facing the display panel 1, of the cover film 2; an orthographic projection of the light-shielding layer 10 on the cover film 2 covers part of the light-transmitting hole V1 and an orthographic projection of a portion, adjacent to light-transmitting hole V1, of the display region AA on the cover film 2; a first through hole H1 is arranged in a position, corresponding to the light-transmitting hole V1, in the light-shielding layer 10; and the first through hole H1 has a smaller diameter than the light-transmitting hole V1.

During specific implementation, in the display module provided in the embodiment of the present disclosure, as shown in FIGS. 3-5, a central axis of the first through hole H1 coincides with a central axis of the light-transmitting hole V1, such that light-shielding layer 10 may uniformly shade a periphery of the light-transmitting hole V1.

During specific implementation, in the display module provided in the embodiment of the present disclosure, the material of the light-shielding layer may be ink.

During specific implementation, in the display module provided in the embodiment of the present disclosure, as shown in FIGS. 3-5, the display module further includes a back film 7 located on one side, away from the cover film 2, of the display panel 1; and the back film 7 has a second through hole H2 corresponding to the light-transmitting hole V1.

During specific implementation, in the display module provided in the embodiment of the present disclosure, as shown in FIGS. 3-5, the display module further includes a supporting layer 8 located on one side, away from the cover film 2, of the back film 7; the supporting layer 8 has a third through hole H3 corresponding to the light-transmitting hole V1; and a distance (that is, a horizontal distance) between an inner wall of the third through hole H3 and an inner wall of the light-transmitting hole V1 is larger than 0 in an extension direction of the cover film 2, so as to facilitate subsequent mounting of a camera. Specifically, the material of the supporting layer may be stainless steel.

It is to be noted that FIGS. 3-5 show only one structure in a display module, and other structures may be included according to the different types of display panel in practical applications, which are not specifically limited herein.

During specific implementation, as shown in FIGS. 3-5, a shape of the light-transmitting hole V1 in the embodiment of the present disclosure is a rectangle but is not limited thereto, and the shape of the light-transmitting hole may also be a circle, an oval, a U shape, other irregular shapes, etc.

With FIG. 3 as an example, attaching and manufacturing processes of the display module as shown in FIG. 3 are described below.

(1) A display panel 1 is manufactured on a back film 7, and shape cutting is performed on the back film 7 and the display panel 1 to form a required shape, for example, a rectangular shape.

(2) A hole is formed in a display region of the display panel 1, to form a light-transmitting region BB and a display region AA surrounding the light-transmitting region BB.

(3) A polarizer 4 is attached to a light-emitting side of the display panel 1, and a certain position is reserved on the light-emitting side of the display panel 1, to support a transparent supporting structure 3 subsequently.

(4) A cover film 2 is provided, and a light-shielding layer 10 is bonded to one side of the cover film 2 through an optically clear adhesive layer 6.

(5) The transparent supporting structure 3 is bonded to the other side of the optically clear adhesive layer 6, and a position of the transparent supporting structure 3 corresponds to a position of the light-transmitting hole V1.

(6) The cover film 2 in step (5) and the display panel 1 in step (3) are attached and aligned, then the transparent supporting structure 3 is attached to an upper portion of the light-transmitting hole V1 of the display panel 1 and located on the same layer as the polarizer 4, and a preset distance is provided between the transparent supporting structure 3 and the polarizer 4.

(7) A supporting layer 8 is bonded to one side, away from the display panel 1, of the back film 7.

The display module as shown in FIG. 3 may be obtained in a mounting sequence of steps (1)-(7).

During specific implementation, when the display module as shown in FIG. 3 is manufactured through an attaching process of steps (1)-(7), an attachment tolerance exists in each step, the polarizer 4 and the display panel 1 have an attachment tolerance between about 0.1 mm, the polarizer 4 has an opening contour tolerance about 0.1 mm, and the cover film 2 and the polarizer 4 has an attachment tolerance about 0.15 mm. A gap between the polarizer 4 and the transparent supporting structure 3 has a width D1 greater than or equal to 0.45 mm in an extension direction of the cover film 2.

During specific implementation, as shown in FIG. 3, the light-shielding layer 10 and the cover film 2 have an attachment tolerance between about 0.1 mm through the optically clear adhesive layer 6, the transparent supporting structure 3 has a contour tolerance about 0.1 mm, and the transparent supporting structure 3 has an attachment tolerance about 0.2 mm. In the embodiment of the present disclosure, an overlapping portion of the orthographic projections of the light-shielding layer 10 and the transparent supporting structure 3 on the cover film 2 has a width D2 greater than or equal to 0.4 mm. Further, in consideration of a shielding effect of the light-shielding layer 10 on the display panel 1, a width value of D2 may also be greater than 0.44 mm.

During specific implementation, in the display module provided in the embodiment of the present disclosure, as shown in FIG. 3, the light-transmitting hole V1 has an opening tolerance about 0.1 mm, and the cover film 2 and the polarizer 4 have an attachment tolerance between about 0.15 mm. A distance D3 between an inner wall of the light-transmitting hole V1 and a side edge a of the transparent supporting structure 3 is greater than or equal to 0.44 mm in an extension direction of the cover film 2.

Based on the same disclosure concept, an embodiment of the present disclosure further provides a display device. The display device includes the display module provided in the embodiments of the present disclosure.

Figure 7:
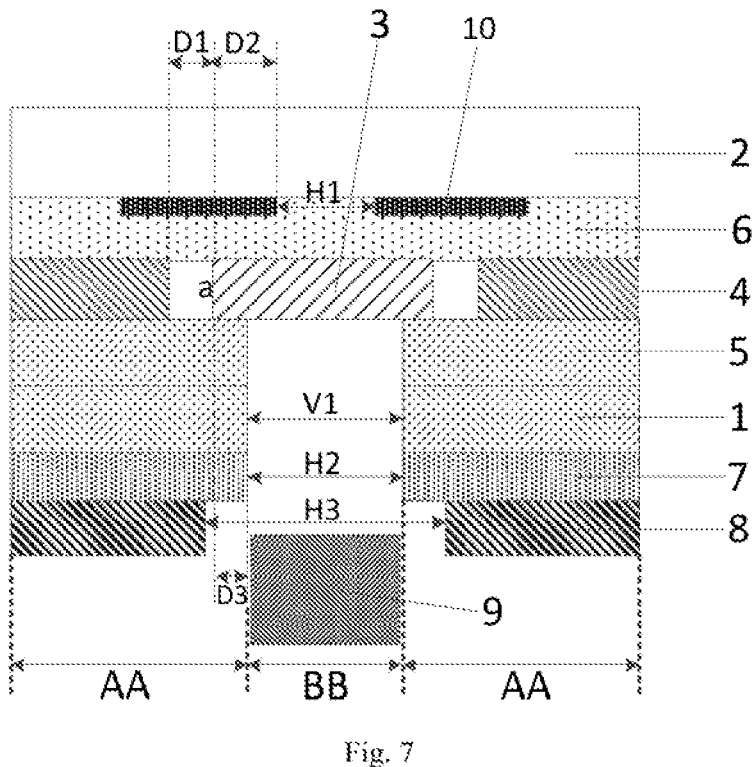
FIG. 7 is a schematic diagram of a sectional structure of another display device provided in an embodiment of the present disclosure.
Figure 8:
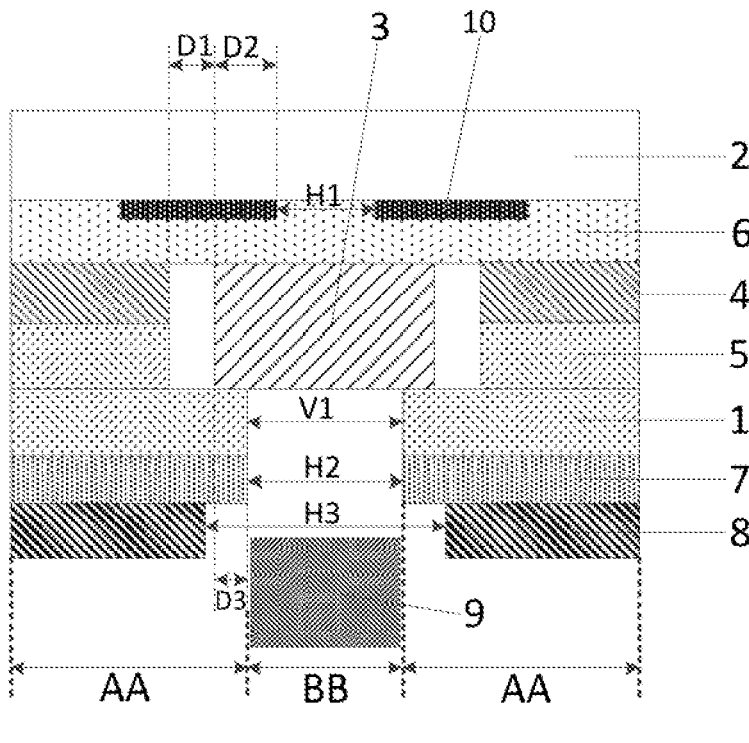
FIG. 8 is a schematic diagram of a sectional structure of yet another display device provided in an embodiment of the present disclosure.

During specific implementation, in the display module provided in the embodiment of the present disclosure, as shown in FIGS. 6-8, the display module further includes a camera 9, and the camera 9 is at least partially located in the light-transmitting hole V1. Specifically, the light-transmitting hole V1 is used to transmit light required by the camera 9, and thus, the present disclosure guarantees requirements of light transmittance of the camera 9 integrated below the display panel. The hole is dug in the display module, to accommodate at least part of the camera 9, such that the space occupied by the camera 9 in the display region of the display module is reduced, and a screen-to-body ratio of a display apparatus is improved.

Specifically, as shown in FIGS. 6-8, the light-transmitting hole V1 may be a through hole penetrating the display panel 1, and may also be a blind hole, that is, a transparent layer is reserved in the blind hole and opaque layers are etched away. When the light-transmitting hole V1 is a through hole, the camera 9 may penetrate deep into the light-transmitting hole V1. When the light hole V1 is a blind hole, part of the camera 9 is located in the light-transmitting hole V1, such that the camera 9 is accommodated in an area corresponding to the light-transmitting hole V1 of the display panel 1. Whether the camera 9 penetrates into the light hole V1 and a penetration extent of the camera into the light-transmitting hole are determined according to actual conditions.

The problem solution principle of the display device is similar to that of the display module, such that the implementation of the display device may refer to the implementation of the display modules above, which will not be repeated herein.

During specific implementation, in this embodiment of the present disclosure, the display device may be any product or part with a display function, for example, a mobile phone, a tablet personal computer, a television, a display, a notebook computer, a digital photo frame, a navigator, etc. Other essential components of the display device will be understood by those of ordinary skill in the art, and are not described in detail herein, nor are they intended to be limiting of the present disclosure.

According to the display module and the display device provided in the embodiments of the present disclosure, the transparent supporting structure in the display module is located on one side, facing the cover film, of the display panel; and the transparent supporting structure covers the light-transmitting hole. Such that the transparent supporting structure is arranged between an upper portion of the light-transmitting hole of the display panel and the cover film in the present disclosure, and the transparent supporting structure may have strength compensation on the position of the light-transmitting hole. The orthographic projection of the transparent supporting structure on the cover film and the orthographic projection of the display panel on the cover film have an overlapping region, that is, a periphery of the transparent supporting structure is supported by the display panel, such that the transparent supporting structure may better support the cover film at the light-transmitting hole and prevent the cover film from sagging. Therefore, the display module provided in the embodiments of the present disclosure may prevent the problem that photographing performance of the camera is influenced by sagging of the cover film at the light-transmitting hole (that is, the camera hole) due to the fact that the other light-proof film layers are cut off at the light-transmitting hole.

While the preferred embodiments of the present disclosure have been described, additional alterations and modifications to those embodiments may be made by those skilled in the art once the basic inventive concept is apparent to those skilled in the art. Therefore, it is intended that the appended claims are to be interpreted to include the preferred embodiments and all alterations and modifications that fall within the scope of the present disclosure.

It will be apparent to those skilled in the art that various modifications and variations can be made to the embodiments of the present disclosure without departing from the spirit and scope of the embodiments of the present disclosure. Thus, if modifications and variations to the present disclosure fall within the scope of the appended claims and their equivalents, it is intended that the disclosure cover such modifications and variations as well.

What is claimed is:

1. A display module, comprising:
a display panel, comprising a display region and a light-transmitting region, wherein the light-transmitting region has a light-transmitting hole;
a cover film arranged on a light-emitting side of the display panel and covering the display region and the light-transmitting region; and
a transparent supporting structure arranged on one side, facing the cover film, of the display panel;
wherein the transparent supporting structure covers the light-transmitting hole; and
an orthographic projection of the transparent supporting structure on the cover film and an orthographic projection of the display panel on the cover film have an overlapping region;
wherein the display module further comprises a polarizer arranged on one side, facing the cover film, of the display panel;
wherein the polarizer and the transparent supporting structure are arranged on a same layer; the polarizer is arranged around the transparent supporting structure; and a gap is provided between the polarizer and the transparent supporting structure;

wherein the display module further comprises a touch layer between the display panel and the polarizer; a gap is provided between the touch layer and the transparent supporting structure; and a thickness of the transparent supporting structure is equal to a total thickness of the polarizer and the touch layer in a thickness direction of the display panel.

2. The display module according to claim 1, wherein a material of the transparent supporting structure is transparent glass.

3. The display module according to claim 1, wherein the gap has a width greater than or equal to 0.45 mm in an extension direction of the cover film.

4. The display module according to claim 1, further comprising an optically clear adhesive layer arranged between the polarizer and the cover film;
wherein an orthographic projection of the optically clear adhesive layer on the cover film covers orthographic projections of the display region and the light-transmitting region on the cover film; and
the transparent supporting structure is bonded to the optically clear adhesive layer.

5. The display module according to claim 1, further comprising a light-shielding layer arranged on one side, facing the display panel, of the cover film;
wherein an orthographic projection of the light-shielding layer on the cover film covers part of the light-transmitting hole and an orthographic projection of a portion, adjacent to light-transmitting hole, of the display region on the cover film;
a first through hole is arranged in a position, corresponding to the light-transmitting hole, in the light-shielding layer; and
the first through hole has a smaller diameter than the light-transmitting hole.

6. The display module according to claim 5, wherein a central axis of the first through hole coincides with a central axis of the light-transmitting hole; and
an overlapping portion of the orthographic projections of the light-shielding layer and the transparent supporting structure on the cover film has a width greater than or equal to 0.4 mm.

7. The display module according to claim 5, wherein a material of the light-shielding layer is ink.

8. The display module according to claim 1, wherein in an extension direction of the cover film, a distance between an inner wall of the light-transmitting hole and a side edge of the transparent supporting structure is greater than or equal to 0.44 mm.

9. The display module according to claim 1, further comprising a back film arranged on one side, away from the cover film, of the display panel;
wherein the back film has a second through hole corresponding to the light-transmitting hole.

10. The display module according to claim 9, further comprising a supporting layer arranged on one side, away from the cover film, of the back film;
wherein the supporting layer has a third through hole corresponding to the light-transmitting hole; and
in an extension direction of the cover film, a distance between an inner wall of the third through hole and an inner wall of the light-transmitting hole is larger than 0.

11. A display device, comprising the display module according to claim 1.

12. The display device according to claim 11, further comprising a camera at least partially arranged in the light-transmitting hole.

* * * * *